United States Patent
Czachowski et al.

(10) Patent No.: US 12,405,298 B2
(45) Date of Patent: Sep. 2, 2025

(54) AUTOMOTIVE CONTROLLER TESTING

(71) Applicant: Aptiv Technologies AG, Schaffhausen (CH)

(72) Inventors: Przemyslaw Czachowski, Dublin (IE); Maciej Borowiec, Dublin (IE)

(73) Assignee: APTIV TECHNOLOGIES AG, Schaffhausen (CH)

(*) Notice: Subject to any disclaimer, the term of this patent is extended or adjusted under 35 U.S.C. 154(b) by 342 days.

(21) Appl. No.: 18/049,930

(22) Filed: Oct. 26, 2022

(65) Prior Publication Data

US 2023/0139159 A1  May 4, 2023

(30) Foreign Application Priority Data

Oct. 29, 2021 (GB) .................................. 2115615

(51) Int. Cl.
*G01R 31/00* (2006.01)
*G01R 31/28* (2006.01)

(52) U.S. Cl.
CPC ....... *G01R 31/007* (2013.01); *G01R 31/2834* (2013.01)

(58) Field of Classification Search
CPC .............. G01R 31/007; G01R 31/2834; G01R 31/006; G01R 31/2841; G01R 31/2844;
(Continued)

(56) References Cited

U.S. PATENT DOCUMENTS 4,694,408 A * 9/1987 Zaleski ................ G01R 31/007
701/99
4,757,463 A 7/1988 Ballou et al.
(Continued)

FOREIGN PATENT DOCUMENTS

EP 0231607 8/1987

OTHER PUBLICATIONS

"Body Control Module Tester", Retrieved at: http://appl-dsp.com/body-control-module-tester/—on Sep. 23, 2022, 2 pages.
(Continued)

*Primary Examiner* — Hunter B Lonsberry
*Assistant Examiner* — Jalal C Coduroglu
(74) *Attorney, Agent, or Firm* — Harness, Dickey & Pierce, P.L.C.

(57) ABSTRACT

Disclosed is a testing device for an automotive controller, which includes a plurality of Device Under Test (DUT) lines for connection to respective DUT lines in the automotive controller, and first and second multiplexers for selecting individual DUT lines. First and second measurement modules are connected to the multiplexers for measuring signal characteristics on the selected DUT lines. An interconnect circuit is operable for selectively connecting stimulation modules to the measurement modules for stimulating electrical signals on the selected DUT lines. A controller is provided to control the switching of the multiplexers and the interconnect circuit and for receiving the measured signal characteristics from the first and second measurement modules for testing the respective DUT lines in the automotive controller. Also disclosed are methods and software for controlling testing devices.

20 Claims, 1 Drawing Sheet

(58) Field of Classification Search
CPC .............. G01R 31/282; G05B 23/0256; G05B 2219/24065
See application file for complete search history.

(56) References Cited

U.S. PATENT DOCUMENTS

| | | | | |
|---|---|---|---|---|
| 5,177,447 | A * | 1/1993 | Marino | G01R 31/007 |
| | | | | 701/99 |
| 5,646,865 | A * | 7/1997 | Alfaro | G05B 19/048 |
| | | | | 701/32.7 |
| 6,157,877 | A * | 12/2000 | Jones | G01R 31/367 |
| | | | | 73/114.61 |
| 8,717,042 | B1 * | 5/2014 | Seguine | G01R 27/2605 |
| | | | | 710/305 |
| 2002/0091471 | A1 * | 7/2002 | Suzuki | G01M 15/02 |
| | | | | 701/32.9 |
| 2003/0206021 | A1 * | 11/2003 | Laletin | G01R 31/386 |
| | | | | 324/426 |
| 2006/0270357 | A1 * | 11/2006 | Puente | G01R 31/31926 |
| | | | | 455/67.11 |
| 2008/0180116 | A1 * | 7/2008 | Fujiwara | G01R 31/31715 |
| | | | | 324/750.3 |
| 2009/0121908 | A1 | 5/2009 | Regier | |
| 2010/0017094 | A1 * | 1/2010 | Stewart | G05B 13/048 |
| | | | | 701/102 |
| 2010/0229038 | A1 * | 9/2010 | Mayer | H04L 12/40189 |
| | | | | 714/E11.159 |
| 2013/0179720 | A1 * | 7/2013 | Bellows | G06F 5/065 |
| | | | | 713/401 |
| 2018/0175855 | A1 * | 6/2018 | Romano | H03K 17/166 |
| 2019/0346482 | A1 * | 11/2019 | Kiyokawa | G01R 1/0466 |
| 2022/0094354 | A1 * | 3/2022 | Chen | G01R 19/0084 |

OTHER PUBLICATIONS

"Portable Electronic Tester (PET)", Retrieved at: https://conti-engineering.com/highlights/portable-electronic-tester-pet/—on Sep. 23, 2022, 4 pages.

"Search Report", GB Application No. 2115615.3, Jul. 7, 2022, 3 pages.

"Extended European Search Report", EP Application No. 22199485.8, Feb. 8, 2023, 5 pages.

* cited by examiner

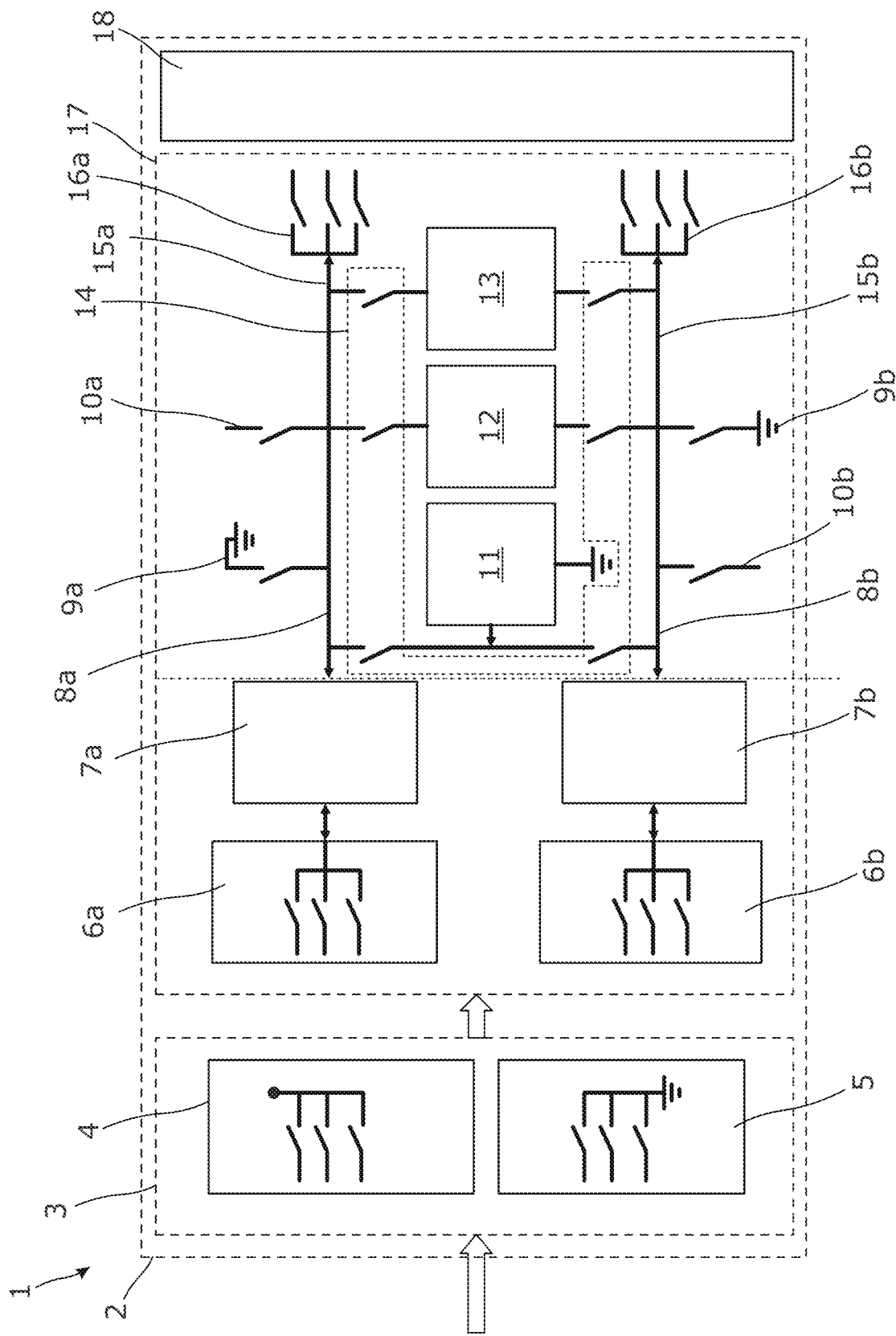

AUTOMOTIVE CONTROLLER TESTING

INCORPORATION BY REFERENCE

This application claims priority to United Kingdom Patent Application No. GB2115615.3, filed Oct. 29, 2021, the disclosure of which is incorporated by reference in its entirety.

BACKGROUND

In automotive applications, it is often necessary to conduct testing of automotive electronic control units, such as Body Controller Modules (BCMs). In order to automate such tests, it is usually important for the testing device to be able to test all lines of Device Under Test (DUT) in one testing cycle, and the total number of lines to be tested can often be over 300. In addition, there are many types of lines to be tested, including analog, digital, bus (CAN, LIN, FlexRay, etc), inputs and outputs, voltage-driven or resistance-driven, high-side or low-side, different output currents, constant or pulse-width modulation (PWM). Each type of DUT line requires different circuitry, which results in test devices being large and expensive.

One issue with the above is that, in some instances, it is necessary for Customer Support Engineers (CSEs) to visit vehicle manufacturing sites to perform testing, for example, after the vehicle manufacturer reports a faulty sample. Unfortunately, there are currently no commercially available portable testing devices which can be directly connected to multiple DUT lines without additional circuitry. As such, it is often difficult for a CSE to transport the necessary hardware for testing when travelling by air or car to the manufacturing site. For instance, any testing device would need to comply with regular airline luggage weight and size limitations, for example by being under 23 kg in weight. Equally, any testing device would need to be sufficiently compact to allow the device to fit inside the trunk of a typical passenger car. Consequently, current portable testing devices represent a compromise and are often not capable of automatically testing the large number of DUT lines in a modern BCM.

The present disclosure is therefore directed to addressing the above issues.

SUMMARY

The present disclosure relates to testing devices for testing an automotive controller, as well as methods and software for controlling testing devices. The disclosure is particularly relevant to portable automotive controller testing devices, and testing devices for Body Controller Modules (BCMs), as well as software for operating the testing device hardware.

According to a first aspect there is provided a testing device for an automotive controller, including: a plurality of Device Under Test (DUT) lines for connection to respective DUT lines in the automotive controller; first and second multiplexers, each for selecting individual DUT lines from the plurality of DUT lines; first and second measurement modules connected to the first and second multiplexers, respectively, for measuring signal characteristics on DUT lines selected by each multiplexer; a stimulation block including a plurality of stimulation modules for stimulating electrical signals; and an interconnect circuit operable for selectively connecting stimulation modules to the first and second measurement modules for stimulating electrical signals on the selected DUT lines; and a controller for controlling the switching of the first and second multiplexers and the interconnect circuit to connect selected individual DUT lines to the stimulation modules and for receiving the measured signal characteristics from the first and second measurement modules for testing the respective DUT lines in the automotive controller.

In embodiments, the test device is provided as an IO card for connection to a computer.

In embodiments, the testing device further includes a plurality of channel switches for switchably connecting the DUT lines to a power source.

In embodiments, the plurality of channel switches includes a plurality of low side switches for connecting DUT lines to ground.

In embodiments, the plurality of channel switches includes a plurality of high side switches for connecting DUT lines to a Vehicle Battery Voltage, VBATT.

In embodiments, the plurality of high side switches includes a current sensor for sensing the current on the respective DUT line.

In embodiments, the controller further controls the switching of the channel switches.

In embodiments, the first and second measurement modules each include at least one of a voltage sensor, a current sensor, and a pulse width modulation (PWM) sensor for respectively measuring the voltage, current and PWM values on DUT lines selected by each multiplexer.

In embodiments, the plurality of stimulation modules includes at least one of an adjustable voltage output module, a resistor decade module, and an adjustable load module.

In embodiments, the stimulation block further includes a VBATT terminal and a ground terminal, and wherein the interconnect circuit is operable for selectively connecting one or more of the stimulation modules and the first and second measurement modules to the VBATT and ground terminals.

In embodiments, the controller is configured to receive test instructions, wherein the test instructions include instructions for setting a state of one of the DUT lines by controlling the switching of one or more of the first and second multiplexers, the interconnect circuit, and the channel switches to apply the state to the respective DUT line.

In embodiments, the controller is configured to control, based on a line state logic, the switching of the first and second multiplexers, the interconnect circuit, and the channel switches to prevent an incorrect state being applied to the DUT lines.

According to a second aspect there is provided a method of controlling a testing device according to the above, the method including: controlling the switching of first and second multiplexers and the interconnect circuit to connect selected individual DUT lines to the stimulation modules; receiving measured signal characteristics from the first and second measurement modules; and outputting a test response for individual DUT lines in the automotive controller based on the measured signal characteristics for that DUT line.

According to a third aspect there is provided a non-transitory computer readable medium storing software for controlling a testing device according to the above and including instructions which, when executed by a processor, perform the steps of: controlling the switching of first and second multiplexers and the interconnect circuit to connect selected individual DUT lines to the stimulation modules; receiving measured signal characteristics from the first and second measurement modules; and outputting a test response for individual DUT lines in the automotive controller based on the measured signal characteristics for that DUT line.

BRIEF DESCRIPTION OF THE DRAWING

An illustrative embodiment will now be described with reference to the accompanying drawing in which the drawing shows a schematic diagram of a testing device according to an illustrative embodiment.

DETAILED DESCRIPTION

The drawing shows a schematic illustration of an automotive controller testing device 1 according to an embodiment. In this embodiment, the testing device 1 is provided on an input/output (IO) card 2 which provides a compact device and allows the card to be mounted into a computer case or server rack.

The IO card 2 supports the circuitry needed for testing the plurality of DUT (Device Under Test) lines on the automotive controller being tested. As such, a single device is provided for allowing all the DUT lines 3 required for testing to be connected directly to the card 2, with all necessary signal conditioning and processing taking place on the circuit board of the card 2. This thereby avoids the need for additional equipment in order to perform testing and consequently saves space and weight.

In this embodiment, the device 1 includes sixty-four (64) DUT lines 3 which correspond to sixty-four output lines within the automotive controller to be tested. The device 1 includes an interface for connecting the device 1 to the controller bus to establish communication over the sixty-four (64) DUT lines.

The DUT lines 3 are connected to a channel switching block which is used to power the device under test, namely the controller. In this embodiment, sixty-four low side channel switches 5 and four high side channel switches 4 are provided. Each of the channel switches 4, 5 is associated with an individual DUT line 3. As such, by switching individual ones of the low side switches 5, DUT lines 3 can be independently connected to ground (GND). Equally, the four DUT lines 3 associated with the four high side switches 4 can be selectively connected to the vehicle battery voltage (VBATT) supplied through the device 1. The four high side switches 4 include current sensors for measuring current levels on the respective DUT line 3.

In this embodiment, the output current on the DUT lines 3 is limited to 0.9 A constant and 3 A peak. All the DUT lines 3 are capable of 32V.

The sixty-four (64) DUT lines are also connected to two 64:1 multiplexers 6a, 6b, which are provided independent to the channel switching block 3, with each multiplexer being operable to select one DUT line to be tested at a time. As such, the device allows up to two DUT lines to be tested at the same time. In this embodiment, the multiplexers are implemented using MOSFET relays, which thereby provide a good balance of size, reliability, and current capabilities.

Each of the two multiplexers 6a, 6b is connected to a sensor module 7a, 7b which includes sensors for measuring voltage, current and pulse width modulation (PWM) conducted therethrough. As such, the sensor modules 7a, 7b sense the voltage, current and PWM on the line selected by the respective multiplexer 6a, 6b. Accordingly, at any one time, the signals on two selected DUT lines can be characterised by measuring the line voltage relative to ground, the current (in this embodiment in two ranges; 80 mA and 2 A), and voltage PWM. The sensor modules 7a, 7b may have a selectable threshold value for the PWM measurement. Furthermore, in this embodiment, the voltage and current measurements are digitised with the A/D conversion time being selected from several pre-defined values. This may, for example, be used to provide average voltage or current values over a pre-determined time period.

The sensor modules 7a, 7b are each connected to a sensor line 15a, 15b which, by virtue of the connection established by the multiplexers 6a, 6b, effectively form part of the two selected DUT lines. The sensor lines 15a, 15b form part of a stimulation block 17 which is used to generate or modulate electrical signals on the sensor lines 15a, 15b, and consequently on the DUT selected by the multiplexers 6a, 6b and sensed by the sensor modules 7a, 7b. In this connection, the stimulation block 17 includes a set of stimulation modules for stimulating electrical signals. In this embodiment, the modules include an adjustable voltage output module 11, a resistor decade module 12, and an adjustable load module 13, as is described in further detail below. The stimulation block 17 further includes VBATT terminals 10a, 10b and ground terminals 9a, 9b associated with the each of the sensor lines 15a, 15b, as well as an interconnect circuit 14. The interconnect circuit 14 includes a plurality of switches operable for selectively connecting the stimulation modules 11, 12, 13 and VBATT 10a, 10b and ground terminals 9a, 9b to the sensor lines 15a, 15b. Consequently, these modules and power terminals may be dynamically connected to the selected DUT lines such that the hardware circuitry connected to a DUT line may be varied. The interconnect circuit 14 is also arranged such that the two selected DUT lines may be connected together. In this embodiment, MOSFET relays are used to implement the switchable connections within the interconnect circuit 14, which thereby provide good balance between size, reliability, and current capabilities.

With regard to the stimulation modules, the adjustable voltage output module 11 is used to output an analog voltage source output. As such, this may be used when the selected DUT line for testing is a voltage analog input. In this embodiment, a 16-bit resolution output is provided, with a maximum current limited by a thermal design power of 3 W.

The resistor decade module 12 can be connected for use with both input or output DUT lines, as either a resistive load or a resistive stimulation. The resistor decade module 12 in this embodiment has a resistance range of 10Ω-100 kΩ in 1Ω steps, with a thermal design power of 2 W being high enough for use as a resistive load. The resistor decade module 12 is also bi-directional such that current can flow in either direction across the module.

The adjustable load module 13 can be connected for use as a load for DUT output lines. The current of the load may be adjusted, in this embodiment with a 16-bit resolution and 0-0.9 A range. This module is uni-directional, current can flow in only one direction.

The stimulation block 17 in this embodiment further includes two sets of switchable external connectors 16a, 16b which are used for connecting external devices to the sensor lines 15a, 15b. These external connectors 16a, 16b may be used in instances when the IO card 2 doesn't directly support a particular DUT line type. For instance, if a DUT line in an automotive controller is used for a bus line, such as CAN, CAN FD, LIN bus, an external bus channel may be connected via one of the external connectors 16a, 16b for conducting the communication test. The external connectors 16a, 16b may also be used for connecting other specialized test equipment.

The device 1 further includes a controller 18 which controls the switching of the channel switches 4, 5, the multiplexers 6a, 6b and the interconnect circuit 14. As such, the hardware connected to the DUT lines may be dynamically configured.

In use, an operating voltage can be supplied to the automotive controller being tested by connecting several DUT lines to ground (GND) and VBATT using the channel switches 4, 5. The multiplexers 6a, 6b may then be operated under the control of the controller 18 to sequentially test the DUT lines of the automotive controller by selecting two DUT lines at a time and connecting different hardware to these lines through the interconnect circuit 14. As such, the DUT lines may be tested by selectively connecting them to an analog output, a resistor decade, an electronic load, ground, VBATT, as well as external devices, such as CAN or LIN channels. Furthermore, the resistor decade module 12 and adjustable load module 13 can be connected in a high side (HS), low side (LS) or inter-line configuration. Accordingly, the testing device 1 provides support for testing various DUT line types, including:

According to various embodiments, DUT output lines may include:
  High side and low side outputs—the interconnect circuit 14 allows connection of the resistor decade module 12 to either GND or VBATT at the other end.
  Fault detecting outputs—as the maximum output current is limited, in this embodiment to 0.9 A constant, open line detection is prevented, even in the highest current range. Open state detection may be implemented simply by disconnecting the relevant DUT line.
  Analog outputs (voltage and current)—as the sensor modules 7a, 7b have voltage and current measurement capabilities for measuring analog output values.
  PWM outputs—the sensor modules 7a, 7b have PWM measurement capabilities, with selectable threshold values. In this embodiment, the frequency range of PWM measurement is 1 Hz-30 kHz.

According to various embodiments, DUT output lines may include:
  High side and low side inputs—the interconnect circuit 14 allows connection of the resistor decade module 12 to either GND or VBATT at the other end.
  Analog voltage inputs—The adjustable voltage output module 11 can be used to stimulate this kind of DUT input.
  Analog resistance inputs—the resistor decade module 12 can be connected.
  PWM inputs—PWM generation is available on both selected DUT lines by fast shorting to GND or VBATT using the MOSFET relays. This may be controlled by an internal PWM signal generated by the microcontroller 18.
  Bus line (e.g. CAN, CAN FD, LIN, FlexRay) inputs—The external connectors 16 may be used to connect an external bus interface. The MOSFET relays within the device introduce very little resistance and capacity and consequently don't disturb bus communications.

In this embodiment, the device 1 is further provided with an ethernet port for connection to a computer. Ethernet provides for multiple testing devices 1 to be controlled from the computer, as well as allowing long cables to be used and providing good reliability in noisy conditions. In other embodiments, the testing device 1 may be provided with a WiFi interface for allowing control via a WiFi connection. This thereby eliminates the need for a cable connection between, for instance, a laptop and the testing device. In other embodiments, the device 1 may also include a USB connection for connecting the device to a computer for control.

It will be understood that the flexibility of the hardware design of the device 1 would potentially allow for a number of incorrect or forbidden connections to be established. For example, the interconnect circuit 14 could potentially short VBATT and GND together. To prevent such incorrect connections, the software implemented by the controller 18 prevents operability of the switches in the interconnect circuit 14 from establishing incorrect connections. This thereby provides for safe and intuitive use of the device 1.

In this connection, the software includes line state logic, that serve to abstract away the specifics of hardware design from the end user. In particular, control of the multiplexers 6a, 6b and the interconnect circuit 14 is hidden from the end user to prevent forbidden and unexpected connections. Instead, the end user, via a computer, may input DUT line state instructions to the controller 18, with the controller 18 determining the switch settings to apply the state to the respective DUT line in accordance with the instructions. For instance, a DUT line state instruction setting a specific DUT line to state "CURRENT 0.5" causes the controller 18 to operate one of the multiplexers 6a, 6b to select the DUT line. The controller 18 also controls the interconnect circuit 14 to connect the selected line to the adjustable load module 13 and sets output current to 0.5 A. As such, an intuitive testing system is provided to the end user.

As the device 1 is only able to select a maximum of two DUT lines 3 at a time, the step of setting the state of a new DUT line may require disconnecting the currently connected DUT line. To facilitate this, two alternative switching modes are provided for, namely:
  Implicit line disconnection—in this mode, when a user requests a change of state on a DUT line that requires disconnection of another DUT line, that line is automatically disconnected by the controller 18 without additional user interaction. This prevents any incorrect interconnections or other forbidden combinations within the device.
  Forced explicit disconnection—in this mode, if a user requests a change of state on a DUT line that requires disconnection of another DUT line, the controller 18 outputs an error signal which reports including a message indicating which line has to be disabled first. This mode forces explicit disconnection (i.e. switching to an OFF state) of each line after a test on that line has completed.

The controller 18 may be set to one of the above modes depending on the testing requirements.

The line state logic also takes into consideration the switching delays associated with actioning connection and disconnection instructions. For example, MOSFET relays have different connection and disconnection times. Accordingly, in order to prevent incorrect connections being made during transition periods between the testing of one DUT line to another, the controller software inserts delays into the switching sequence controlling the multiplexers 6a, 6b and interconnect circuit 14 when necessary.

The line state logic also takes into consideration both current and thermal overload protection. That is, in order to provide for a compact testing device 1, the IO card 2 and the components on it are effectively "undersized" in terms of their current and power capabilities. As such, there is a risk that these components could be damaged due to current or power overload. The software instructions in the controller 18 firmware therefore uses current and voltage sensor feedback from both the channel switches 4, 5 and the sensor modules 7a, 7b to provide fast reaction in the event of a detected overload scenario to cut off the overloaded lines.

In this connection, if the current on a DUT line 3 exceeds a maximum threshold, for example 3 A, then the controller 18 will action the immediate disconnection of this line 3. This thereby prevents damage to the device 1 in the event of a sudden increase in current.

In addition to the maximum current threshold, embodiments may also have an average current threshold. For example, as discussed above, the device 1 may continuously calculate an average current value, for instance over the last 0.5 s period. If the controller 18 determines that this average current exceeds a pre-set average current threshold, for example 1.1 A, the controller 18 will action the immediate disconnection of the line 3.

The controller software also provides for additional resistor decade module 12 protection. This is advantageous due to the limited maximum power that can be dissipated through the module's resistors. In this respect, the firmware continuously calculates the power dissipated on each of the module's resistors and compares it to a maximum allowed power threshold. If the dissipated power exceeds the limit, the controller 18 will action the immediate disconnection the resistance module 12 and a warning indicator, such as an LED on the device 1, will be activated to alert the end user.

The controller software also provides for thermal overload protection of the adjustable voltage output module 11 and the adjustable load module 13. In particular, these modules are provided with temperature sensors which provide feedback to the controller 18. If the temperature of either of these modules exceeds a lower temperature threshold, such as 70° C., the controller 18 may trigger a warning indicator, such as a red-green flashing indication sequence an LED on the device 1 to alert the end user of the high temperature. In this scenario, the module may be kept operating. However, if the temperature of either of these modules exceeds a higher temperature threshold, such as 100° C., the controller 18 may action the immediate disconnection the module and a warning indicator, such as a red indication on an LED on the device 1, will be activated to alert the end user.

In addition to individual DUT line state instructions provided by the user, it will be understood that the end user may instruct for a testing sequence to be implemented through the device 1. For example, an end user may use a laptop or other computer connected to the device 1 to initiate an automatic testing sequence for testing the functionality of a connected automotive controller. In response, the computer may automatically issue a sequence of DUT line state instructions to the controller 18, and then log the response feedback from the controller 18 to those applied DUT line states. As such, an automated testing process may be implemented on all DUT lines of an automotive controller using a compact testing device 1.

It will be understood that the embodiment illustrated above show applications only for the purposes of illustration. In practice, embodiments may be applied to many different configurations, the detail of which being straightforward for those skilled in the art to implement.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

What is claimed is:

1. A testing device for an automotive controller, comprising:
    a plurality of Device Under Test (DUT) lines configured to connect to respective output lines in the automotive controller;
    first and second multiplexers, each for selecting individual DUT lines from the plurality of DUT lines;
    first and second measurement modules connected to the first and the second multiplexers, respectively, for measuring signal characteristics on selected individual DUT lines selected by each multiplexer;
    a stimulation block comprising a plurality of stimulation modules for stimulating electrical signals;
    an interconnect circuit operable for selectively connecting the plurality of stimulation modules to the first and the second measurement modules for stimulating electrical signals on the selected individual DUT lines; and
    a controller configured to:
        control switching of the first and the second multiplexers and the interconnect circuit to connect selected individual DUT lines to the plurality of stimulation modules; and
        receive measured signal characteristics from the first and the second measurement modules for testing the respective DUT lines in the automotive controller.

2. The testing device according to claim 1, wherein the testing device is provided as an input/output (IO) card for connection to a computer.

3. The testing device according to claim 1, further comprising:
    a plurality of channel switches for switchably connecting one or more DUT lines of the plurality of DUT lines to a power source.

4. The testing device according to claim 3, wherein the plurality of channel switches includes a plurality of low side switches for connecting one or more of the DUT lines to ground.

5. The testing device according to claim 3, wherein the plurality of channel switches includes a plurality of high side switches for connecting one or more of the plurality of DUT lines to a Vehicle Battery Voltage.

6. The testing device according to claim 5, wherein the plurality of high side switches includes a current sensor for sensing a current on a respective DUT line associated with a high side switch of the plurality of high side switches.

7. The testing device according to claim 3, wherein the controller is further configured to control the switching of the channel switches.

8. The testing device according to claim 3, wherein the controller is further configured to:
    receive test instructions, wherein the test instructions include instructions for setting a state of one of the DUT lines by controlling switching of at least one of:
        the first and the second multiplexers;
        the interconnect circuit; or one or more channel switches of the plurality of channel switches to apply the state to the respective DUT line.

9. The testing device according to claim 3, wherein the controller is further configured to:
control, based on a line state logic, the switching of the first and the second multiplexers, the interconnect circuit, and one or more of the channel switches of the plurality of the channel switches to prevent an incorrect state being applied to one of the DUT lines.

10. The testing device according to claim 1, wherein the first and the second measurement modules each include at least one of:
a voltage sensor;
a current sensor; or
a pulse width modulation (PWM) sensor, for respectively measuring a voltage, a current, and one or more PWM values on the selected individual DUT lines selected by at least one of the first and the second multiplexers.

11. The testing device according to claim 1, wherein the plurality of stimulation modules comprises at least one of:
an adjustable voltage output module;
a resistor decade module; or
an adjustable load module.

12. The testing device according to claim 1, wherein the stimulation block further includes a Vehicle Battery Voltage (VBATT) terminal and a ground terminal, and wherein the interconnect circuit is operable for selectively connecting one or more of the stimulation modules of the plurality of stimulation modules and the first and the second measurement modules to the VBATT terminal and ground terminal.

13. A method of controlling a testing device, the method comprising:
controlling switching of first and second multiplexers and an interconnect circuit to connect selected individual Device Under Test (DUT) lines of a plurality of DUT lines to stimulation modules;
receiving measured signal characteristics from first and second measurement modules connected to the first and the second multiplexers, respectively; and
outputting a test response for respective output lines in an automotive controller based on the measured signal characteristics for the selected individual DUT lines.

14. The method of claim 13, further comprising:
controlling switching of channel switches connecting one or more DUT lines of the plurality of DUT lines to a power source.

15. The method of claim 14, wherein the channel switches include a plurality of high side switches configured to connect one or more DUT lines of the plurality of DUT lines to a Vehicle Battery Voltage.

16. The method of claim 14, further comprising:
receiving test instructions, wherein the test instructions include instructions for setting a state of one of the selected individual DUT lines by controlling the switching of at least one of:
the first and the second multiplexers;
the interconnect circuit; or
one or more of the channel switches to apply the state to the respective DUT line.

17. The method of claim 14, further comprising:
controlling, based on a line state logic, the switching of the first and second multiplexers, the interconnect circuit, and one or more of the channel switches to prevent an incorrect state being applied to one of the selected individual DUT lines.

18. The method of claim 14, wherein the channel switches include a plurality of low side switches for connecting one or more of DUT lines of the plurality of DUT lines to ground.

19. The method of claim 13, wherein the first and the second measurement modules each include at least one of:
a voltage sensor;
a current sensor; or
a pulse width modulation (PWM) sensor, for respectively measuring a voltage, a current, and one or more PWM values on the selected individual DUT lines selected by at least one of the first and the second multiplexers.

20. A non-transitory computer readable medium storing software for controlling a testing device and comprising instructions which, when executed by a processor, perform the steps of:
controlling switching of first and second multiplexers and an interconnect circuit to connect selected individual Device Under Test (DUT) lines to stimulation modules;
receiving measured signal characteristics from first and second measurement modules connected to the first and the second multiplexers, respectively; and
outputting a test response for respective DUT lines in an automotive controller based on the measured signal characteristics for the selected individual DUT lines.

* * * * *